(12) United States Patent
Chen et al.

(10) Patent No.: US 11,499,246 B2
(45) Date of Patent: Nov. 15, 2022

(54) CRYSTAL RAW MATERIAL LOADING DEVICE COMPRISING A PLURALITY OF RECEPTACLES ARRANGED RELATIVE TO A SEED CRYSTAL BEARING DEVICE AND SEMICONDUCTOR CRYSTAL GROWTH DEVICE COMPRISING THE SAME

(71) Applicant: Hunan Sanan Semiconductor Co., Ltd., Hunan (CN)

(72) Inventors: Zebin Chen, Hunan (CN); Minfeng Wang, Hunan (CN); Hongji Liao, Hunan (CN); Huarong Chen, Hunan (CN)

(73) Assignee: HUNAN SANAN SEMICONDUCTOR CO., LTD., Hunan (CN)

( * ) Notice: Subject to any disclaimer, the term of this patent is extended or adjusted under 35 U.S.C. 154(b) by 0 days.

(21) Appl. No.: 17/212,713

(22) Filed: Mar. 25, 2021

(65) Prior Publication Data

US 2021/0301417 A1    Sep. 30, 2021

(30) Foreign Application Priority Data

Mar. 30, 2020    (CN) .......................... 202010235219.5

(51) Int. Cl.
*C30B 35/00*    (2006.01)
*C30B 23/02*    (2006.01)
(Continued)

(52) U.S. Cl.
CPC .......... *C30B 23/02* (2013.01); *C23C 14/0635* (2013.01); *C23C 14/243* (2013.01); *C23C 14/50* (2013.01); *C30B 29/36* (2013.01)

(58) Field of Classification Search
CPC ......... C30B 23/00; C30B 23/02; C30B 23/06; C30B 29/00; C30B 29/10; C30B 29/36;
(Continued)

(56) References Cited

U.S. PATENT DOCUMENTS

2005/0016462 A1\* 1/2005 Yamazaki ............... C23C 14/12
                                                        427/255.6
2013/0263785 A1\* 10/2013 Hsiung ................. C30B 23/005
                                                        118/728

FOREIGN PATENT DOCUMENTS

CN    101027433 B    5/2010
CN    202390579 U    8/2012
(Continued)

OTHER PUBLICATIONS

Search Report for Chinese Application No. 2020102352195 (dated Oct. 17, 2020).

*Primary Examiner* — Kenneth A Bratland, Jr.
(74) *Attorney, Agent, or Firm* — Stetina Brunda Garred & Brucker (57) ABSTRACT

A crystal raw material loading device and a crystal growth device includes a plurality of bearing units which are arranged adjacent to each other horizontally in turn, and the multiple bearing units include a first bearing unit arranged at one end of a small plane far away from the seed crystal bearing device. Along the direction from one end of the small plane far away from the seed crystal to one end of the small plane close to the seed crystal, from the first bearing unit to the bearing unit on the side of the small plane close to the seed crystal, the height of the raw material that can be carried by each bearing unit is reduced in turn.

14 Claims, 6 Drawing Sheets

(51) Int. Cl.
*C23C 14/06* (2006.01)
*C23C 14/24* (2006.01)
*C23C 14/50* (2006.01)
*C30B 29/36* (2006.01)

(58) Field of Classification Search
CPC ..... C30B 35/00; C30B 35/002; C30B 35/007; C23C 14/0635; C23C 14/243; C23C 14/50
USPC ........... 117/84, 88, 101, 200, 204, 937, 951; 118/715, 726, 728
See application file for complete search history.

(56) References Cited

FOREIGN PATENT DOCUMENTS

| | | | |
|---|---|---|---|
| CN | 102459718 | B | 10/2014 |
| CN | 106929919 | A | 7/2017 |
| CN | 207498512 | U | 6/2018 |
| CN | 106400116 | B | 1/2019 |
| CN | 110004486 | A | 7/2019 |
| CN | 110656376 | B | 2/2021 |
| JP | 2000044394 | A | 2/2000 |
| JP | 2000044395 | A | 2/2000 |
| JP | 2001072491 | A | 3/2001 |
| JP | 2014210672 | A | 11/2014 |

* cited by examiner

CRYSTAL RAW MATERIAL LOADING DEVICE COMPRISING A PLURALITY OF RECEPTACLES ARRANGED RELATIVE TO A SEED CRYSTAL BEARING DEVICE AND SEMICONDUCTOR CRYSTAL GROWTH DEVICE COMPRISING THE SAME

CROSS-REFERENCE TO RELATED APPLICATIONS

This application claims priority to Chinese Utility Patent Application No. 202010235219.5 entitled "CRYSTAL MATERIAL LOADING DEVICE AND CRYSTAL GROWTH DEVICE" filed before China's National Intellectual Property Administration on Mar. 30, 2020, the entire contents of each of which are incorporated herein by reference.

STATEMENT RE: FEDERALLY SPONSORED RESEARCH/DEVELOPMENT

Not Applicable

BACKGROUND

1. Technical Field

The present disclosure relates to the technical field of crystal growth equipment, in particular to a crystal raw material loading device and a crystal growth device.

2. Related Art

Silicon carbide single crystal material has the characteristics of wide band gap, high thermal conductivity, high breakdown electric field and high radiation resistance. Semiconductor device fabricated therewith can meet the needs of high power and high radiation devices. It is an ideal substrate material for high temperature, high frequency, high power and high radiation devices, It has been widely used in hybrid electric vehicles, high-voltage power transmission, LED lighting, aerospace and other fields, and the growth of high-quality SiC (silicon carbide) crystals is the basis to realize the excellent performance of these SiC based devices.

SiC crystal will not appear in nature, and only through synthesis can SiC crystals be obtained. At present, the main methods of SiC single crystal are physical vapor transport (also known as physical vapor deposition), high temperature chemical vapor deposition, liquid phase epitaxy and so on. Among them, the physical vapor transport method is the most mature, which is adopted by most research institutions and companies in the world. PVT uses medium frequency induction heating and high density graphite crucible as heating body. SiC powder is placed at the bottom of the graphite crucible, and SiC seed is on the top of the graphite crucible. The C (carbon) surface is generally used as the growth surface for the growth of 4H SiC. By adjusting the heat preservation layer on the outside of the crucible, the temperature in the SiC raw material zone is higher than that in the top crucible cover. Then, the SiC powder must be sublimated directly into Si (SI), Si2C (SIC), SiC (t 25) (SIC) and other gases at a temperature above 2100° C. and a low pressure environment, and then transferred from the high temperature region to the seed crystal in the lower temperature region along the temperature gradient to form silicon carbide single crystal.

The doping of impurities in SiC grown by physical vapor transport method is in line with the trend found in CVD (chemical vapor deposition) growth of silicon carbide. Both of them have facet effect. That is to say, the impurity concentration in the small plane region is different from that in the non-small plane region. Generally, the nitrogen doping concentration in the small plane region is higher.

According to the academic research, the polymorph transformation is basically from the small plane, and the research also found that the high supersaturation of the growth atmosphere is more likely to occur polymorphic transformation. Once the facet is transformed, the polymorph will propagate rapidly and grow to the center of the growth plane until the whole growth surface is covered, which will seriously affect the yield of the crystal. Reducing the polymorph transformation in the process of silicon carbide growth by physical vapor transport method has always been a challenge.

SUMMARY

The object of the present disclosure is to provide a loading device for crystal raw materials to reduce the probability of polytype transformation in the process of crystal growth.

The embodiments of the present disclosure also aim to provide a crystal growth device to reduce the probability of polytype transformation in the process of crystal growth.

The crystal raw material loading device may be used for placing in the crystal growth device. The seed crystal bearing device may be arranged on the top of the crystal raw material loading device in the crystal growth device, and the crystal raw material loading device may include a plurality of bearing units which are arranged adjacent to each other horizontally in turn. The first bearing unit may be arranged at one end of the small plane far away from the seed crystal on the seed bearing device.

From the first bearing unit to the side of the first bearing unit close to the small plane of the seed crystal, the height of the raw material that can be carried by each bearing unit may decrease in turn along the direction of one end away from the small plane of the seed crystal to one end of the small plane close to the seed crystal.

Further, the crystal raw material loading device may include a substrate, and the matrix is arranged with a plurality of chambers with top openings along the horizontal direction, each of which forms a bearing unit.

From the first bearing unit to the side of the first bearing unit close to the seed crystal, the height of the side wall of each bearing unit decreases in turn along the direction of one end away from the small plane of the seed crystal to one end of the small plane close to the seed crystal.

Furthermore, the first bearing unit may be cylindrical, and the load-bearing unit on one side of the first bearing unit close to the small plane of the seed crystal may be arranged in a semi-circular or annular manner around the first bearing unit in turn.

Furthermore, the cross section of the first bearing unit may be circular, and the load-bearing units on one side of the first bearing unit close to the small plane of the seed crystal may be arranged in semicircle or ring shape around the first bearing unit in turn.

The center of the circle corresponding to the loading unit on one side of the first bearing unit close to the small plane of the seed crystal may be arranged in turn on the side where the center of the first bearing unit is close to the small plane of the seed crystal, and the connecting lines of the centers of the multiple bearing units may be arranged in a straight line.

Further, the crystal raw material loading device may also include a porous plate which is covered on one side of the first bearing unit close to the small plane of the seed crystal.

The crystal growth device provided by the embodiments of the present disclosure may be provided with a crystal raw material loading device in the crystal growth device, and a seed crystal bearing device may be arranged above the crystal raw material loading device in the crystal growth device.

Preferably, the bearing surface of the seed crystal bearing device for placing the seed crystal is inclined, and one end of the small plane of the seed crystal is arranged close to the high end of the bearing surface.

Preferably, the direction of the bearing surface and the main growth gradient of the crystal growth device is 80~89.5 degrees.

Preferably, the crystal growth device comprises a crucible and a heating mechanism, and the seed crystal bearing device is a crucible cover;

The heating mechanism may comprise an induction heating coil, which is wound on the outside of the crucible, and the two ends of the induction heating coil are located on the same side of the crucible.

One end of the small plane of the seed crystal may be arranged close to the orientation of the two ends of the induction heating coil.

Preferably, the seed bearing device comprises a main body part and a seed crystal bearing part, and the seed bearing part and the main body part are clamped and connected through dovetail groove.

The crystal raw material loading device may be used for placing in the crystal growth device, and the seed crystal bearing device is arranged above the crystal raw material loading device in the crystal growth device, and the crystal raw material loading device includes a plurality of bearing units which are arranged adjacent to each other horizontally in turn. A plurality of bearing units include a first bearing unit corresponding to one end of a small plane far away from the seed crystal bearing device, and a bearing unit arranged along the direction from one end of the small plane far away from the seed crystal to one end of the small plane close to the seed crystal, from the first bearing unit to the side of the small plane close to the seed crystal of the first bearing unit. The height of the raw material that can be carried by each loading unit decreases in turn. The crystal raw material loading device makes the surface of the raw material protrude when containing the growth raw material of the crystal, and the protruding position is the position of the first bearing unit, which corresponds to the end of the seed crystal far away from the small plane, and the raw material at the position of the first bearing unit is closest to the seed crystal. In the process of silicon carbide crystal growth by physical vapor transmission method, when the temperature is heated to 2100° C., the pressure in the chamber of the crystal growth device is lower than 100 mabr (millibar), and the raw material begins to sublimate. Because the side wall of the crystal growth device is a heating body, the temperature of the raw material near the side wall of the crystal growth device is high, and the temperature of the raw material in the middle is low, 2ore, the temperature gradient of the raw material is inward from the side wall of the crystal growth device. When the raw material starts to sublimate, the gases such as Si, Si (M25) C, SiC (M25) in the growth atmosphere will be transported along the temperature gradient to the end of the seed crystal far away from the small plane (i.e., the position of the first bearing unit), and then the silicon carbide single crystal will be deposited at the end of the seed crystal far away from the small plane, Then the growth atmosphere is transported to the small plane again. At this time, the atmosphere transported to the small plane is unsaturated and the growth rate is reduced. The corresponding nucleation free energy is increased, and the corresponding polytype transition probability in the small plane is reduced, which improves the yield of crystal growth.

The crystal growth device provided by the embodiments of the present disclosure may be provided with a crystal raw material loading device, and the crystal growth device may be provided with a seed crystal bearing device above the crystal raw material loading device.

BRIEF DESCRIPTION OF THE DRAWINGS

In order to more clearly explain the specific embodiments of the invention or the technical solutions in the prior art, the following will briefly introduce the specific embodiments or the drawings needed in the description of the prior art. The drawings described below are some embodiments of the present disclosure. For ordinary technical personnel in the art, on the premise of not paying creative labor, other drawings may also be obtained from these drawings.

Reference Numbers: 100 bearing unit; 110 first bearing unit; 120 second bearing unit; 130 third bearing unit; 140 fourth bearing unit; 200 porous plate; 300 crucible; 310 crucible cover; 311 main body part; 312 seed bearing part; 400 induction heating coil; 410 inlet end; 420 outlet end; 500 small plane; 510 seed crystal; b-position of small plane on crucible cover; a-orientation of small plane relative to induction heating coil; T-axis is the main growth temperature gradient; c-axis is the crystal growth axis.

DETAILED DESCRIPTION

The technical scheme of present disclosure will be described clearly and completely in combination with the embodiment. The described embodiment is but one embodiment, not all the embodiments. Based on the embodiment of the present disclosure, all other embodiments obtained by ordinary technical personnel in the art without creative labor belong to the scope of the present disclosure It should be noted that (000-1), (0001), (11-20) and (1-100) in this embodiment are Miller indexes of existing crystallographic expression crystal face family, {0001} is Miller index of existing crystallographic expression crystal plane, <0001> is Miller index of existing crystallographic expression crystal orientation, and [11-20] is Miller index of existing crystallographic expression crystal orientation family.

The height in this embodiment is a relative concept. The side close to the crucible cover 310 is high, and the side near the bottom of crucible 300 is the bottom. That is to say, the direction from low to high is shown in FIG. 6-11, from bottom to top.

The doping of dopants in the growth of PVT (physical vapor transport, also referred to as sublimation) is in line with the trend found in CVD growth of SiC: the nitrogen doping concentration of sublimation method on (000-1) crystal plane is significantly higher than that on (0001) crystal plane, which means that there is a higher doping concentration on (0001) crystal plane. This polarity effect is derived from surface dynamics and has nothing to do with gas composition. Because the doped n (n) atom is located at the lattice point of the carbon lattice, when an N atom is adsorbed on the (000-1) crystal plane, it is bonded with three lower silicon atoms, while on the (0001) crystal plane, only one silicon atom can be bonded. Therefore, the desorption of N atom adsorbed on (000-1) crystal plane must be far less than that on (0001) crystal plane (note that nitrogen vapor pressure is very high at the growth temperature), This is the main reason why the nitrogen doping concentration is higher on the (000-1) crystal plane.

In the central region of silicon carbide {0001} wafers, the doping concentration is usually relatively high, such as the darker color observed in the central region, due to enhanced impurity doping in facet growth. In the process of silicon carbide {0001} ingot growth by sublimation method, a facet 500 of silicon carbide {0001} appears near the center of the ingot, and rapid spiral growth occurs on the facet 500 of this {0001} ingot, but the growth rate along the <0001> direction is relatively low. Therefore, the impurity doping is enhanced in the region of {0001} facet 500. As a result, the doping nitrogen concentration in the central region (small plane region) is usually 20%-50% higher than that in the peripheral region of the wafer.

Some measures to avoid the formation of SiC (silicon carbide) polymorphs in the current process: due to the low stacking fault energy of SiC, when there is no reasonable optimization of the growth conditions, polymorph mixing will occur in the ingot growth. After the stable spiral growth is established in the crystal, an obvious dynamic factor is the replication of the polycrystalline form around the screw dislocation through the spiral growth, and the spiral growth with the height of six diatomic layers as the step dominates the growth surface. The stacking information provided along the edge of the step ensures the replication of the polymorph during crystal growth. As the core of the through screw dislocation acts as a source of infinite steps, so long as the optimized growth conditions are maintained, the spiral growth will run through the whole crystal growth process. When the growth environment is rich in C (carbon), the polymorphs with higher hexagons become stable. Under the condition of C rich growth, 4H SiC is more stable than 6 h SiC. In practical experiments, the most significant parameter determining the polymorph is the polarity of the seed crystal. Under suitable conditions, 6 h SiC ingot can be grown on SiC (0001) (silicon surface) by sublimation method, even if the seed crystal is 4H SiC (0001); conversely, 4H SiC ingot is grown on SiC (000-1) (carbon surface), which is independent of the polymorph of seed crystal. The result can be explained by the difference of surface energy between carbon surface and Si (silicon) surface.4 h SiC preferentially grows at relatively low temperature and low pressure, while 6 h SiC grows at relatively high temperature and high pressure (of course, the temperature and pressure of growth will affect the C/Si ratio of the growth surface). Another important factor is doping impurities. Nitrogen doping can stabilize 4H SiC, while aluminum doping can lead to preferential growth of 6 h SiC, because nitrogen atoms will occupy the lattice point of C (carbon),Nitrogen atoms can make the growth environment a little rich in C (carbon), which is conducive to the growth of 4H SiC.In addition, it is reported that impurity additives such as SC (scandium) and Ce (cerium) stabilize 4H SiC, which can also be explained by the transition from growth environment to C-rich environment.

When SiC (11-20) or SiC (1-100) is used instead of SiC {0001} as seed crystal, perfect polymorph replication can be achieved in a wide range of growth conditions. This phenomenon can also be explained by the following mechanism: the stacking information appears on the SiC (11-20) and SiC (1-100) planes, and the grown crystals inherit the stacking order. On the positive axis {0001} substrate, the step density is very low, and there is a wide {0001} step surface. Therefore, due to the high supersaturation, crystal growth may occur at the step surface by two-dimensional nucleation. The polytype of the growth layer is determined by the growth conditions, especially the growth temperature, which will lead to the growth of 3C SiC (a structural type of silicon carbide crystal) because it is stable at low temperature. On the off-axis {0001} substrate, the step density is high, and the step width is narrow enough relative to the migration of adsorbed reactants to the step. The incorporation point at the step is uniquely determined by the chemical bond at the step. The sublimation method is realized by lateral growth (step flow growth) from the step, and the stacking order of substrate is inherited in this process. In general, the off-axis (oblique) seed crystal is used for step flow growth. By controlling the step density of the seed crystal, the surface step of the seed crystal acts as a template, forcing the seed crystal polymorph to be copied in the sublimation growth method. Off axis growth technology: cutting the surface of the seed crystal at an angle (usually between 1 and 10 degrees) away from the base plane or main axis, so as to provide seeds for growth.

However, even if various measures are introduced to reduce the probability of polytypic formation in the current process, it is still unable to completely avoid the formation of polytypes, and the probability of polytypes is still high.

According to the latest academic research, the transformation of polytypes is basically from the growth of facets, which is consistent with the experience of our engineers. According to the academic research, it is found that the transformation of polytypes is not only related to the small plane, but also closely related to the shape of the growth interface in the process of crystal growth.

The latest research theory also gives the following relations:

$$\Delta G_2 = \frac{b^4 \sigma_l^2}{\Delta \mu - (\sqrt{3}/2) b^2 (\sigma_l + \sigma_i - \sigma_s)}$$

2them, Δ g (M25) is the 2D (two-dimensional) nucleation free energy, B is the first adjacent distance corresponding to the lattice constant in the plane, Δ μ is the chemical potential difference between the gas phase and the solid phase, σ l represents the surface energy of the epitaxial layer, the surface energy of the interface between the epitaxial layer and the substrate, and the surface energy of the σ s lining bottom.

The theory holds that when the lowest 2D nucleation free energy on the crystal surface is located on the facet, the probability of polytype transformation will be greatly increased. When the crystal growth surface is concave, the lowest 2D nucleation free energy of the crystal is located at the edge of the crystal. Because the seed crystal used in the current process is usually off axis seed, the facet will not be located in the center of the crystal like the on axis seed, When the small plane forms or migrates to the crystal edge, the crystal growth surface is concave, and the 2D nucleation free energy of the small plane is the lowest, and the probability of crystal transformation is the highest. When the crystal growth surface is convex, the lowest point of 2D nucleation free energy is located in the center of the crystal. Because the seed crystal used in the current process is usually off axis seed, the facet will not appear in the center of the crystal, which means that controlling the growth interface of the crystal to be convex energy can greatly reduce the probability of crystal form formation. The theory indicates that the free energy of 2D nucleation can be reduced by high supersaturation and high growth rate, which means that the probability of polytype transition is increased.

In other words: in the process of crystal growth, when the growth interface is concave, the 2D nucleation free energy at the small plane is the lowest, and the probability of crystal form transformation in the small plane is greatly increased; when the growth interface is convex, the lowest point of the 2D nucleation free energy is located in the center of the crystal, while there is no small plane at the center of the off-axis seed crystal, so the convex growth interface will not have polymorph transformation.

Based on the above theory, as shown in FIG. 3~FIG. 14, the embodiment of the present disclosure provides a crystal raw material loading device, which is used to place in the crystal growth device, and the seed crystal bearing device is arranged above the crystal raw material loading device in the crystal growth device. The crystal raw material loading device includes a plurality of bearing units 100 which are arranged horizontally adjacent to each other in turn. The plurality of bearing units 100 include a first bearing unit 110 corresponding to one end of the facet 500 far away from the seed crystal 510 to the end of the facet 500 close to the seed crystal along one end of the facet 500 far away from the seed crystal 510, From the first bearing unit 110 to the loading unit 100 located on one side of the small plane 500 of the seed crystal 510 on the first bearing unit 110 close to the seed crystal 510 on the seed carrier device, the height of the raw material that can be carried by each bearing unit 100 decreases in turn.

One end of the facet 500 close to or far away from the seed crystal refers to the position relative to the facet 500 of the seed crystal when the seed crystal is installed on the seed crystal bearing device, that is, when the seed crystal 510 is installed on the seed crystal bearing device, the facet 510 of the seed crystal 510 should be the end close to the seed crystal bearing device, that is, the seed crystal 510 is placed in an off-axis manner, The relative position of the seed crystal is limited when the seed crystal is installed on the seed crystal bearing device.

The first bearing unit 110 is arranged at one end of the small plane 500 of the seed crystal corresponding to the seed crystal, that is, the first bearing unit 110 is arranged roughly below the end of the small plane 500 of the seed crystal on the seed bearing device.

Figure 7:
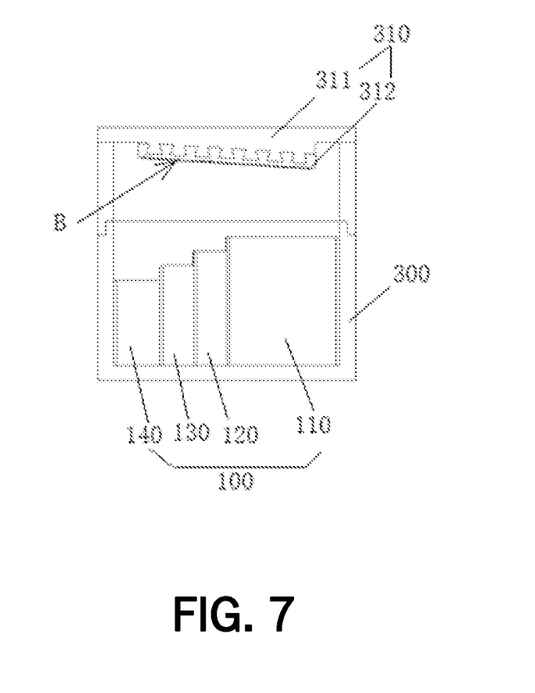
FIG. 7 is a right view of FIG. 6.
Figure 8:
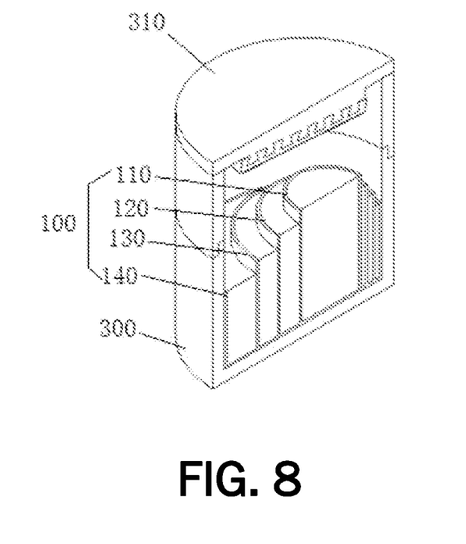
FIG. 8 is a side view of the sectional view of the second crystal material loading device in the crystal growth device provided by the embodiment of the present disclosure.
Figure 9:
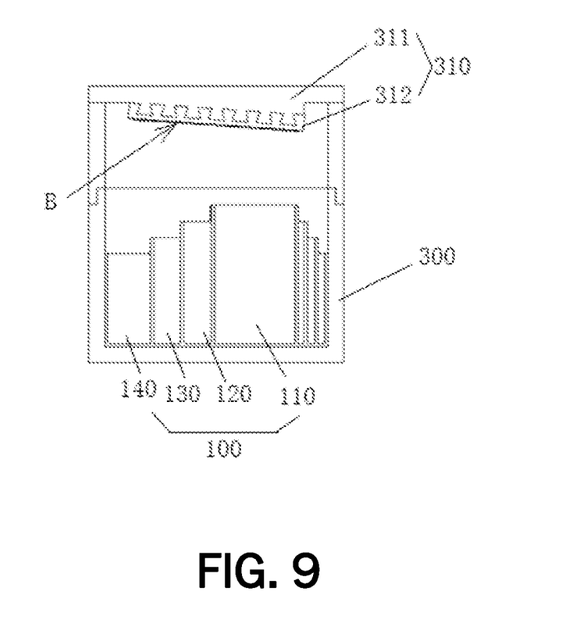
FIG. 9 is a right view of FIG. 8.
Figure 10:
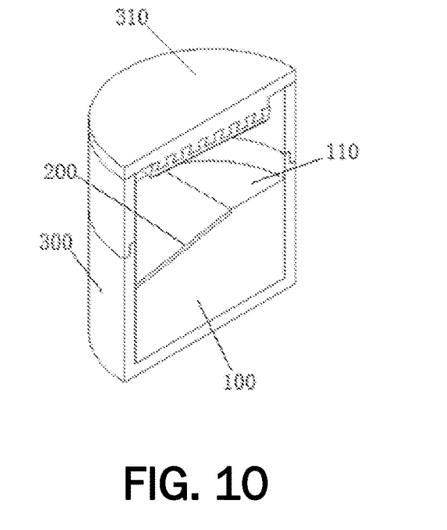
FIG. 10 is a side view of the third crystal material loading device used in the crystal growth device provided by the embodiment of the present disclosure.
Figure 11:
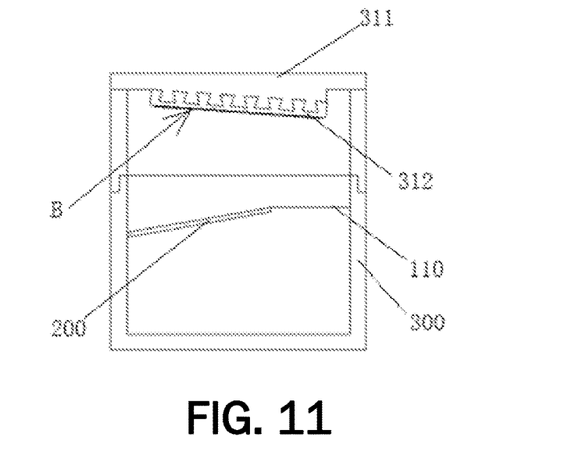
FIG. 11 is a right view of FIG. 10.

In the crystal raw material loading device of the embodiment, when containing the growth raw material of the crystal, the surface of the raw material is raised, and the protruding position is the position of the first bearing unit 110, which corresponds to the end of the seed crystal far away from the small plane, and the raw material at the position of the first bearing unit 110 is the closest to the seed crystal. In the process of silicon carbide crystal growth by physical vapor transmission method, when the temperature is heated to 2100° C., the pressure in the chamber of the crystal growth device is lower than 100 mabr (millibar), and the raw material begins to sublimate. Because the side wall of the crystal growth device is a heating body, the temperature of the raw material near the side wall of the crystal growth device is high, and the temperature of the raw material in the middle is low, 2ore, the temperature gradient of the raw material is from the side wall of the crystal growth device inward (i.e. from the left and right sides to the middle as shown in FIG. 7). When the raw material begins to sublimate, the gases such as Si, Si (M25) C, SiC (M25) in the growth atmosphere will be transported along the temperature gradient to the end far away from the small plane of the seed crystal, At this time, the atmosphere transported to facet 500 is unsaturated and the growth rate is reduced. The corresponding free energy of nucleation is increased, and the probability of polymorph transformation in the small plane is reduced, and the yield of crystal growth is improved.

Specifically, in order to reduce the probability of polymorph transformation, the seed bearing device is used to place the bearing surface of the seed crystal, and one end of the small plane 500 of the seed crystal is set near the high end of the bearing surface. Specifically, the direction of the bearing surface and the main growth gradient of the crystal growth device is 80~89.5 degrees.

As a common seed bearing device, the seed bearing device includes a crucible 300. The seed bearing device is generally a graphite crucible cover of crucible 300, that is, the inner surface of the graphite crucible cover is inclined. The main growth gradient of crucible 300 generally points to the top along the top of the crucible 300, that is, the up and down directions shown in FIGS. 6 to 11.

The first loading unit 110 corresponds to the bottom of the seed crystal placement position of the crucible cover 310. The height of the raw material that can be carried by the first loading unit 110 is the highest, and the height from the bottom of the bearing surface to the high end of the bearing surface of the seed crystal is from the bottom to the high end, The height of the raw material that can be carried by the plurality of bearing units 100 decreases in turn.

As a specific form of the crystal raw material loading device, as shown in FIG. 6~FIG. 9, the crystal raw material loading device includes a substrate, the matrix is provided with a plurality of chambers along the horizontal direction, and the adjacent cavities are separated by a partition wall, and each container forms a bearing unit 100. From the first bearing unit 110 to the bearing unit 100 on one side of the first bearing unit 110 close to the seed crystal facet on the seed bearing device, the height of the side wall of each bearing unit 100 decreases in turn along the direction from one end of the facet 500 far away from the seed crystal on the seed carrier device to the end of the small plane 500 of the seed crystal on the seed bearing device.

As a preferred form, the first bearing unit 110 is cylindrical, and the loading unit 100 on one side of the first bearing unit 110 close to the seed crystal facet 500 on the seed bearing device is arranged in a semi ring or ring shape around the first bearing unit 110 in turn.

In the present embodiment, the cross section of the first bearing unit 110 is circular, and the bearing units on one side of the first bearing unit 110 close to the small plane 500 of the seed crystal on the seed bearing device are arranged in a semi ring shape or a ring shape around the first bearing unit 110 in turn. The center of the circle corresponding to the loading unit 100 on one side of the first bearing unit 110 close to the small plane 500 of the seed crystal on the seed bearing device is successively arranged on the side of the circle center of the first bearing unit 110 close to the small plane 500 of the seed crystal on the seed bearing device. That is to say, the crystal material loading device is a cylinder with eccentric ring structure.

Figure 3:
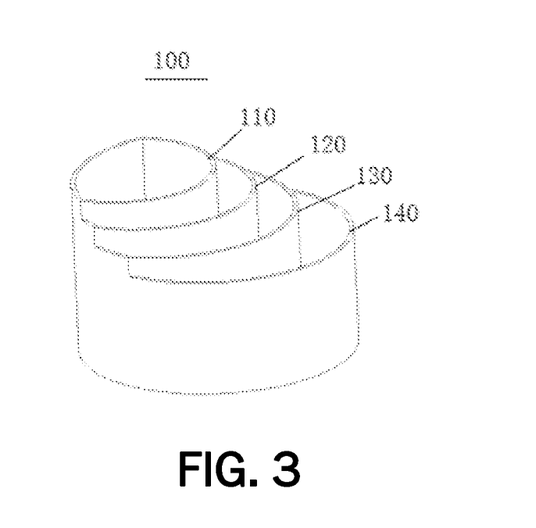
FIG. 3 is a schematic diagram of the first specific form of the crystal material loading device provided by the embodiment of the present disclosure.

As shown in FIG. 3, the first bearing unit 110 is roughly circular, and the bearing unit 100 on the side of the first bearing unit 110 close to the small plane of the seed crystal on the seed bearing device (right side in FIG. 3) is arranged in a semicircle ring around the first bearing unit 110 in turn. In addition to the first bearing unit 110, three bearing units 100 are arranged on the right side of the first bearing unit 110, The second bearing unit 120, the third bearing unit 130 and the fourth bearing unit 140 are in turn. The circle centers of the second bearing unit 120, the third bearing unit 130 and the fourth bearing unit 140 on the right side of the first bearing unit 110 are on the right side of the first bearing unit 110, and the circle centers of the first bearing unit 110, the second bearing unit 120, the third bearing unit 130 and the fourth bearing unit 140 are on the same straight line, The second bearing unit 120, the third bearing unit 130 and the fourth bearing unit 140 are all semi annular. Starting from the first bearing unit 110, the upper edges of the side walls of the second bearing unit 120, the third bearing unit 130 and the fourth bearing unit 140 are set in a step-by-step manner.

It should be noted that a semiring can be a small half ring or a large half ring. It does not refer to a standard semi ring, that is, a semi ring is not a complete ring.

Figure 4:
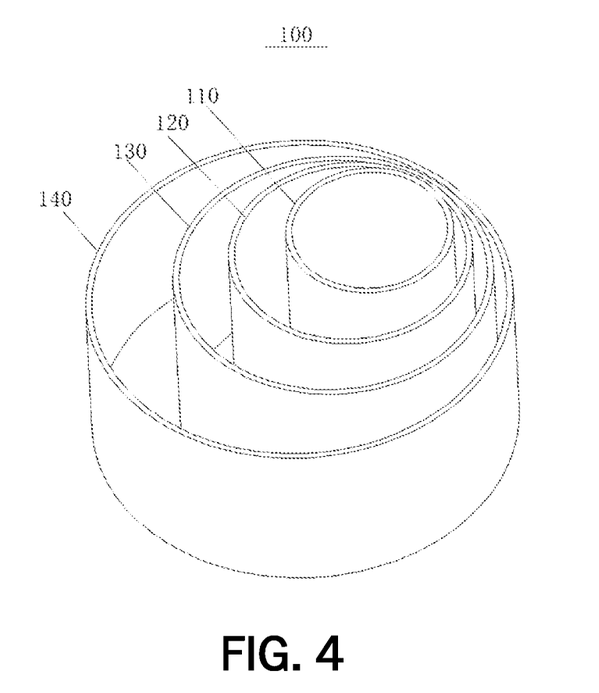
FIG. 4 is a schematic diagram of the second specific form of the crystal material loading device provided by the embodiment of the present disclosure.

As another arrangement form of bearing unit 100, as shown in FIG. 4, the first bearing unit 110 is circular, and the bearing unit 100 located on the side (left side of the figure) of the first bearing unit 110 close to the small plane of the seed crystal on the seed bearing device is arranged in a ring shape around the first bearing unit 110 in turn, The center of the bearing unit on the right side of the first bearing unit 110 is on the right side of the first bearing unit 110. In addition to the first bearing unit 110, there are also three bearing units 100, which are the second bearing unit 120, the third bearing unit 130 and the fourth bearing unit 140. The centers of the first bearing unit 110, the second bearing unit 120, the third bearing unit 130 and the fourth bearing unit 140 are on the same straight line, and the second bearing unit 120, the third bearing unit 130 and the fourth bearing unit 140 still have space for placing raw materials on the left side of the first bearing unit 110. From the first bearing unit 110 to the right or left, the upper edges of the side walls of the second bearing unit 120, the third bearing unit 130 and the fourth bearing unit 140 are arranged in a step-by-step manner.

In addition to the specific form of the crystal raw material loading device given above, this embodiment also provides a specific structure of another raw material loading device.

In this embodiment, the crystal material loading device includes a porous plate 200, which is covered on the bearing unit 100 on one side of the first bearing unit 110 close to the small plane of the seed crystal on the seed bearing device.

Figure 5:
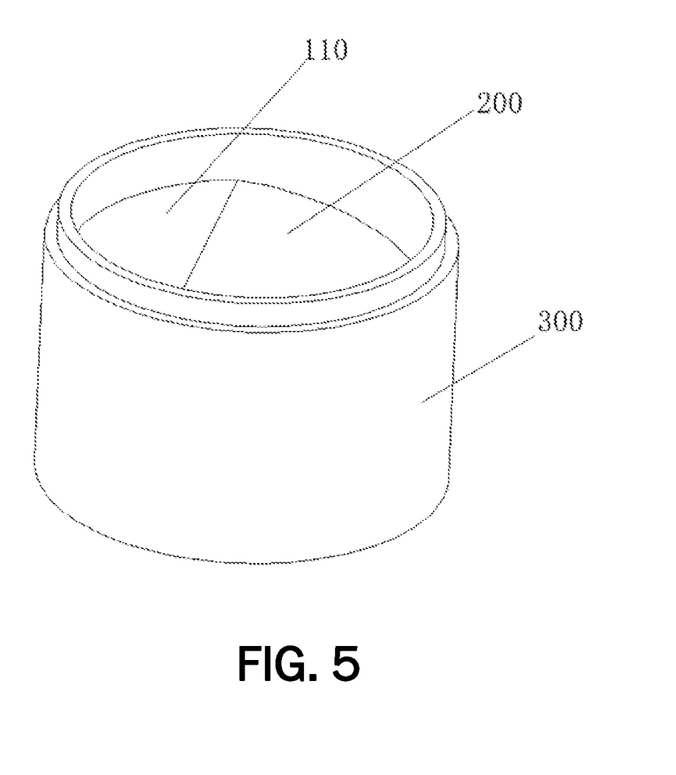
FIG. 5 is a schematic diagram of the third specific form of the crystal material loading device provided by the embodiment of the present disclosure.
Figure 6:
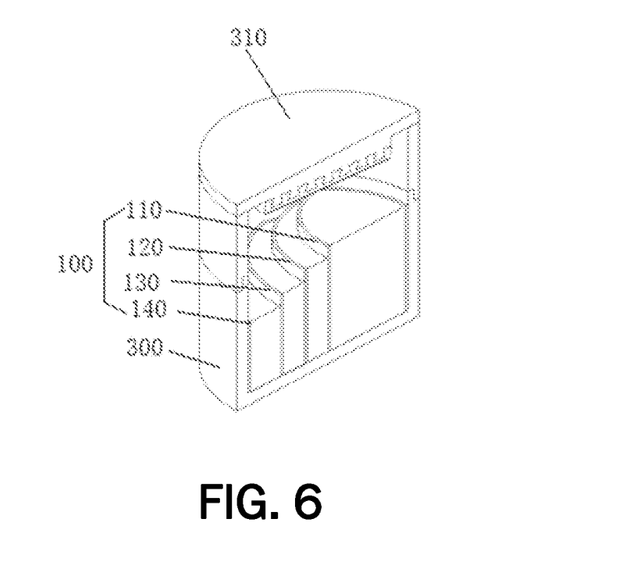
FIG. 6 is a side view of the first crystal material loading device in the crystal growth device provided by the embodiment of the present disclosure.

As shown in FIG. 5, the crystal growth device of the crystal raw material loading device in the embodiment is crucible 300, which can be directly used as the main body of the crystal raw material loading device, or a cylinder body is arranged in the crucible 300 as the raw material loading device body. At this time, a plurality of bearing units 100 are connected as a whole, A multi orifice plate 200 is arranged on the raw material loading device body corresponding to the position of the bearing unit 100 on the right side of the first bearing unit 110, so as to realize the material height reduction from the first bearing unit 110 to the right bearing unit 100 in turn.

It can be understood that the porous plate 200 is only set at the right side of the first loading unit 110, so that when the raw material evaporates, more growth atmosphere moves along the main growth gradient from the first bearing unit 110. Therefore, the growth atmosphere is not only far from the small plane, but also the position of the small plane is more difficult to reach the atmosphere supersaturation, which further reduces the probability of polytype transformation.

It should be noted that, corresponding to the step type crystal growth device as shown in FIG. 3 or FIG. 4, the porous plate 200 can also be covered on the bearing unit 100 (the right side of FIG. 3 and the left side of FIG. 4) close to the small plane 500 of the seed crystal on the first bearing unit 110, i.e. the second bearing unit 120, the third bearing unit 130 and the fourth bearing unit 140, At this time, the porous plate 200 can be arranged obliquely, or a multi hole plate 200 is arranged horizontally above each bearing unit 100.

The porous plate 200 of the embodiment is made of graphite.

The embodiment of the present disclosure also provides a crystal growth device, in which the crystal raw material loading device provided in the embodiment is arranged, and the seed crystal bearing device is arranged above the crystal raw material loading device.

Figure 14:
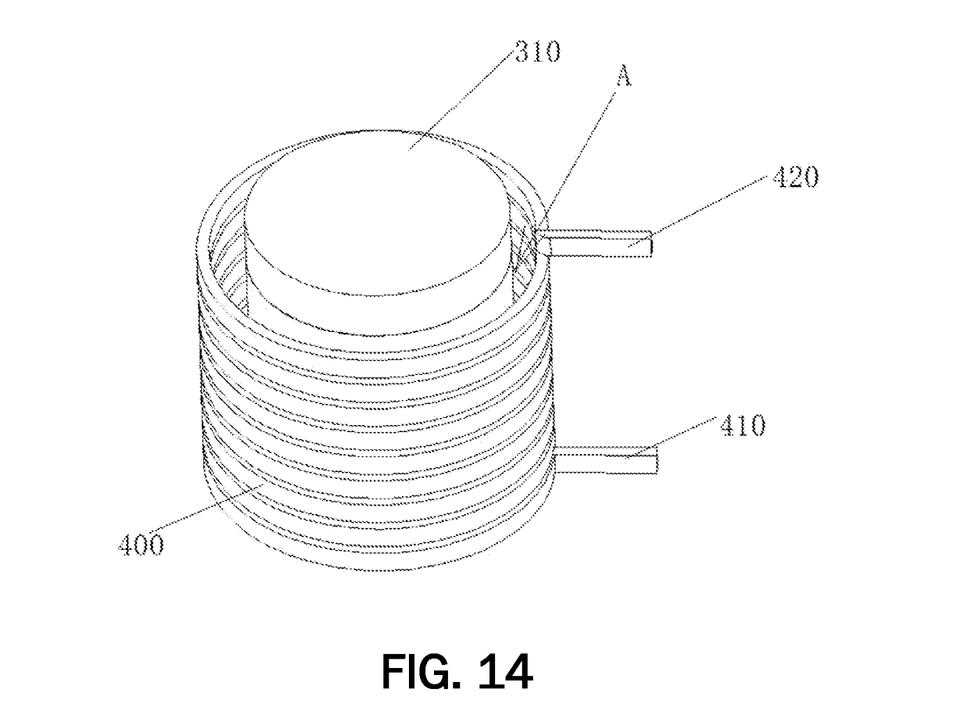
FIG. 14 shows the arrangement diagram of crucible and induction heating coil of the crystal growth device provided by the embodiment of the present disclosure.

Specifically, as shown in FIG. 14, the crystal growth device includes a crucible 300 and a heating mechanism, the seed bearing device is a crucible cover 310, the heating mechanism includes an induction heating coil 400, the induction heating coil 400 is wound on the outside of the crucible 300, and both ends of the induction heating coil 400 are in the same direction; one end of the small plane 500 of the seed crystal is arranged close to the two ends of the induction heating coil 400.

It can be understood that the heating mechanism is a conventional equipment for growing silicon carbide crystal by using crucible 300 in the existing physical vapor transmission method. Generally, the induction heating coil 400 includes a hollow copper tube, the inside of which is filled with water. The lower end of the copper tube is an inlet end 410 of water, and the upper end of the copper tube is an outlet end 420 of water. The copper tube is heated naturally. The general spiral structure of the copper tube is as follows:

the inlet end 410 and the outlet end 420 of the copper tube are in the same direction, and the copper tube rises spirally to form a coil. And there are equidistant turns between each turn of coils. This unique structure makes the coils have the defect of uneven heating. In theory, there will be 0.1-1 turns of coils in the direction of copper pipe entering and leaving (i.e., both ends of induction heating coil 400), which makes the magnetic flux in this direction denser, the change amount of magnetic flux in unit time is more, and the induced current density of crucible 300 in this direction is also larger, so the temperature in the direction of copper pipe entering and leaving on the same horizontal line will be relatively higher. Therefore, placing facets in this direction can slow down the growth rate of facets and avoid the nucleation of facets.

Among them, a in FIG. 14 indicates the orientation of the facet 500 relative to the induction heating coil, that is, the facet 500 of the seed crystal is located close to a position.

Specifically, in order to reduce the probability of polytype transformation, the bearing surface of the seed crystal bearing device for placing the seed crystal is arranged obliquely, and one end of the facet of the seed crystal is arranged close to the high end of the bearing surface. Specifically, the bearing surface is at an angle of 80-89.5 degrees with the direction of the main growth gradient of the crystal growth device.

As a common seed bearing device, the seed bearing device includes a crucible 300, which is generally a graphite crucible cover of the crucible 300, that is, the inner surface of the graphite crucible cover is inclined, and the main growth gradient of the crucible 300 generally points to the top along the bottom of the crucible 300, that is, in the direction shown by the arrow.

Figure 1:
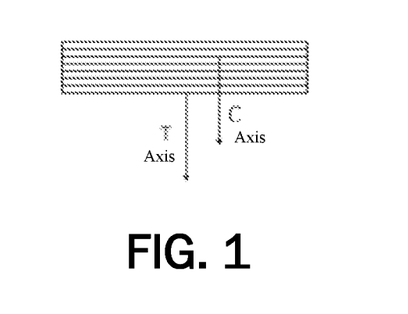
FIG. 1 is the schematic diagram of conventional crystal growth direction.

The schematic principle diagram of the existing conventional crystal growth direction is shown in FIG. 1, and the crystal growth axis C axis is consistent with the main growth temperature gradient T axis, which is easy to cause crystal form transformation.

Figure 2:
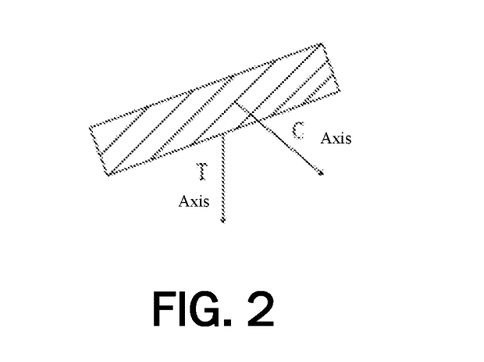
FIG. 2 is the schematic diagram of the crystal growth direction of the crystal growth device provided by the embodiment of the present disclosure.

Aiming at the problem that facets are prone to polytype transformation, the seed crystal is tilted and raised by 0.5-10 degrees along the [11-20] direction, that is, the macro growth plane of the seed crystal forms an angle of about 80-89.5 degrees with the main growth gradient, so that the facets are at a higher position; The angle between the (1-100) crystal plane and the main growth gradient is reduced, which is beneficial for the growth atmosphere to be transported to the junction point of the step (silicon carbide is grown by step flow), and realizes the lateral growth (step flow growth) from the step. In this process, the stacking order of the substrate is inherited, the transmission of crystal form information is realized, and the generation of polymorphism is avoided. The growth principle diagram is shown in FIG. 2.

Corresponding to the inclined arrangement of the inner surface of the graphite crucible cover, the crystal growth device of this embodiment uses the first bearing unit 110 of the seed crystal bearing device provided in this embodiment to be arranged corresponding to the bottom end of the seed crystal placement position of the crucible cover 310, and the height of raw materials that can be carried by the first bearing unit 110 is the highest, and along the bottom end to the high end of the bearing surface of the seed crystal, the heights of raw materials that can be carried by a plurality of bearing units decrease in turn.

The seed crystal bearing device makes the surface of the raw material bulge, and the bulge position is opposite to the lowest part of the inclined seed crystal. The purpose of this design is to make the raw material at the bulge closest to the seed crystal. In the growth by physical vapor transmission method, when the temperature is heated above 2100 degrees Celsius, the pressure in the chamber is lower than 100 mabr, and the raw material begins to sublime. Since the crucible 300 is a heating element, the temperature of the raw material is higher than that of the raw material near the crucible 300. The middle raw material has a low temperature, so the temperature gradient of the raw material is inward. When the raw material begins to sublimate, the growth atmosphere such as Si, Si2C and SiC2 will transport the growth atmosphere to the lowest place of the seed crystal along the temperature gradient, that is, the designed step by step, and then deposit and crystallize into silicon carbide single crystal, and then the growth atmosphere will continue to be transported to the facet along the inclined seed crystal. At this time, the atmosphere transported to the facet is not supersaturated.

In actual growth, the seed crystal is usually fixed on the inner surface of the graphite crucible cover by sticking, and there is a certain probability of sticking failure. In the process of bonding or mechanically fixing the seed crystal, there are uneven gaps or some air holes between the back surface of the seed crystal and the graphite crucible cover due to poor machining accuracy of the surface of the graphite crucible cover, uneven bonding of carbon glue and outgassing of the adhesive during curing. So that the seed crystal often falls off in the curing process, or because the gap between the back of the seed crystal and the graphite crucible cover is too large and there are too many air holes, the seed crystal has to be peeled off and re-bonded. This leads to the problem of yield in the process of seed crystal bonding, while the peeled graphite crucible cover is covered with a layer of adhesive, which makes it impossible to carry out seed crystal bonding again. Rework and re-throw will lead to the problem that the height of the graphite crucible cover can not meet the technological requirements, and the graphite crucible cover can only be scrapped at this time, which greatly increases the production cost. In some existing improved methods, in order to peel off the seed crystal from the seed crystal holder, it is proposed to soak the whole graphite holder in sulfuric acid. However, even if the seed crystal is safely removed, the whole graphite holder is discarded, resulting in a substantial increase in production cost.

To solve this problem, the seed bearing device includes a main body part 311 and a seed bearing part 312, and the seed bearing part 312 and the main body part 311 are clamped and connected through a dovetail groove.

Figure 12:
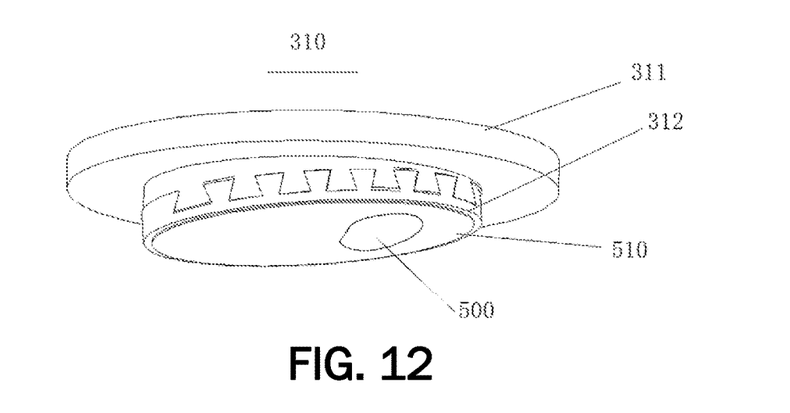
FIG. 12 is a schematic diagram of the graphite crucible cover of the crystal growth device provided by the embodiment of the present disclosure.
Figure 13:
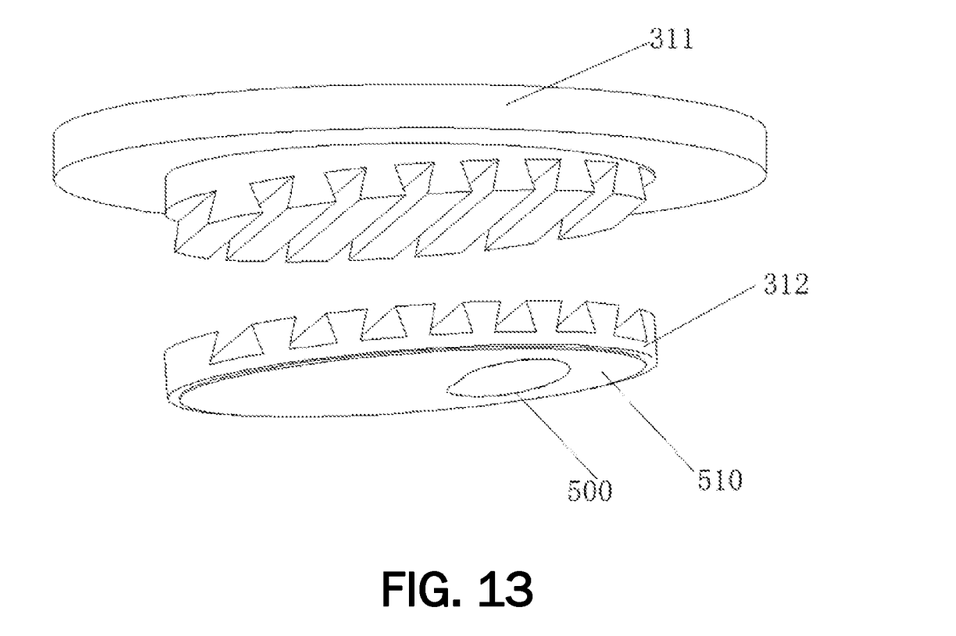
FIG. 13 is a split diagram of FIG. 11.

Specifically, as shown in FIG. 12 or FIG. 13, the seed bearing device is a crucible cover 310, and the graphite crucible cover is divided into two parts, including a main body part 311 and a seed bearing part 312. the main body part 311 is large and is used to cover the crucible 300, and the lower surface of the main body part 311 and the upper surface of the seed bearing part 312 are provided with dovetail grooves matching each other. When the seed bearing part 312 and the seed crystal 510 are pasted and inspected to be qualified, the seed bearing part 312 and the main body part 311 are combined into a whole through dovetail groove structure. The biggest advantage of this design is that even if the seed crystal 510 is poorly bonded, only the seed bearing part 312 needs to be discarded when it is discarded, and the waste of raw materials is less. At the same time, on the premise of greatly reducing the production cost, the main body part 311 does not need to be replaced, so the structure and integrity of the original graphite holder are guaranteed.

It should be noted that in FIG. 12 or 13, a seed crystal 510 is bonded to the crucible cover 310, in which the darker part is the facet 500. B in FIG. 7, FIG. 9 or FIG. 11 refers to the position of the facet on the crucible cover A concrete test example of the crystal growth device of this embodiment is given below.

Sealing the crucible cover 310 bonded with the seed crystal with the crucible 300 inside which the thermal field is placed, wrapping 1-4 layers of graphite soft felt insulation layers with a thickness of 5-10 mm around, at the top and at the bottom of the growth crucible 300, then putting the growth crucible 300 into a crystal growth furnace, first vacuumizing to a pressure below $5*10-2$mbar, filling argon gas to control the pressure in an environment of 1-50 mbar, The graphite crucible 300 is heated by the electromagnetic induction principle. When the heating temperature reaches above 2100 degrees Celsius, the silicon carbide powder begins to sublimate into gases such as Si, Si2C and SiC2, which are transported from the high temperature region to the seed crystal in the lower temperature region along the temperature gradient to deposit and crystallize to form a silicon carbide single crystal. After 5-10 days of deposition and crystallization time, the silicon carbide single crystal growth is completed.

After detection, the 4-inch nitrogen-doped 4H-SiC crystal is grown by using the designed thermal field structure, and the crystal is a single crystal form 4H (an expression of silicon carbide crystal form), and the crystal surface has no macro defects such as miscellaneous crystals and dense microtubules. After cutting, grinding and polishing the crystal, a wafer is obtained. When the crystal is placed under an optical microscope, it can be seen that there are basically no inclusions in SiC crystal, and the density of inclusions is less than 1/cm2, which indicates that using this thermal field structure for crystal growth can effectively reduce the high probability of polytype transformation of facet.

Finally, it should be noted that the above embodiments are only used to illustrate the technical scheme of the present disclosure, but not to limit it. Although the present disclosure has been described in detail with reference to the foregoing embodiments, those of ordinary skill in the art should understand that the technical solutions described in the foregoing embodiments can still be modified, or some or all of the technical features can be equivalently replaced; However, these modifications or substitutions do not make the essence of the corresponding technical solutions deviate from the scope of the technical solutions of each embodiment of the present disclosure.

What is claimed is:

1. A crystal raw material loading device for placement within a crystal growth device including a seed crystal bearing device placed above the crystal raw material loading device, comprising:
   a plurality of receptacles arranged adjacent to each other horizontally in turn, a first one of the receptacles being arranged diagonally opposite to a distal end of a small plane defined by the seed crystal bearing device, from the first receptacle to a side of the first receptacle most proximal to the distal end of the small plane, a height of raw material carried by each of the receptacles decreasing in turn along a direction of the small plane from a proximal end to the distal end.

2. The crystal raw material loading device of claim 1, wherein the crystal raw material loading device comprises a matrix, and the matrix being arranged with a plurality of chambers with top openings along the horizontal direction in turn, with each chamber forming one of the receptacles, from the first receptacle to a side of the first receptacle most proximal to the proximal end of the small plane, the height of the side wall of each receptacle decreasing in turn along the direction of the small plane from the proximal end to the distal end.

3. The crystal raw material loading device of claim 2, wherein the first receptacle is cylindrical, and the loading unit on the side of the first receptacle most proximal to the proximal end of the small plane is arranged in a semi ring or ring shape around the first receptacle in turn.

4. The crystal raw material loading device of claim 3, wherein the cross section of the first receptacle is circular, and the receptacles on the side of the first receptacle most proximal to the proximal end of the small plane are arranged in semicircle or ring shape around the first receptacle in turn, a center of the circle corresponding to a container on one side of the first receptacle most proximal to the proximal end of the small plane is arranged in turn on the side where the center of the first receptacle is most proximal to the proximal end of the small plane, and connecting lines of the centers of the multiple receptacles are arranged in a straight line.

5. The crystal raw material loading device of claim 1, wherein the crystal raw material loading device further comprises a porous plate, and the porous plate is covered on the receptacle on one side of the first receptacle most proximal to the proximal end of the small plane.

6. A crystal growth device, comprising:
   a seed crystal bearing device; and
   a crystal raw material loading device arranged below the seed crystal bearing device, and including a plurality of receptacles arranged adjacent to each other horizontally in turn, a first one of the receptacles being arranged diagonally opposite to an distal end of a small plane defined by the seed crystal bearing device, from the first receptacle to a side of the first receptacle most proximal to the distal end of the small plane, a height of raw material carried by each of the receptacles decreasing in turn along a direction of the small plane from a proximal end to the distal end.

7. The crystal growth device of claim 6, wherein the crystal raw material loading device comprises a matrix, and the matrix being arranged with a plurality of chambers with top openings along the horizontal direction in turn, with each chamber forming one of the receptacles, from the first receptacle to a side of the first receptacle most proximal to the proximal end of the small plane, the height of the side wall of each receptacle decreasing in turn along the direction of the small plane from the proximal end to the distal end.

8. The crystal growth device of claim 7, wherein the first receptacle is cylindrical, and the loading unit on the side of the first receptacle most proximal to the proximal end of the small plane is arranged in a semi ring or ring shape around the first receptacle in turn.

9. The crystal growth device of claim 8, wherein the cross section of the first receptacle is circular, and the receptacles on the side of the first receptacle most proximal to the proximal end of the small plane are arranged in semicircle or ring shape around the first receptacle in turn, a center of the circle corresponding to a container on one side of the first receptacle most proximal to the proximal end of the small plane is arranged in turn on the side where the center of the first receptacle is most proximal to the proximal end of the small plane, and connecting lines of the centers of the multiple receptacles are arranged in a straight line.

10. The crystal growth device of claim 6, wherein the crystal raw material loading device further comprises a porous plate, and the porous plate is covered on the receptacle on one side of the first receptacle most proximal to the proximal end of the small plane.

11. The crystal growth device of claim 6, wherein a bearing surface of the seed crystal bearing device for placing the seed crystal is inclined, and one end of the small plane of the seed crystal is close to the high end of the bearing surface.

12. The crystal growth device of claim 11, wherein the direction of the bearing surface defines an angle of 80 to 89.5 degrees relative to the main growth gradient of the crystal growth device.

13. The crystal growth device of claim 6, wherein the crystal growth device comprises a crucible and a heating mechanism, and the seed crystal bearing device is a crucible cover, and the heating mechanism comprises an induction heating coil wound on the outside of the crucible, two ends of the induction heating coil being located on the same side of the crucible, and one end of the small plane of the seed crystal being arranged close to the orientation of the two ends of the induction heating coil.

14. The crystal growth device of claim 6, wherein the seed crystal bearing device comprises a main body part and a seed crystal bearing part, and the seed crystal bearing part and the main body part are connected by dovetail groove.

* * * * *